United States Patent
Gaboury et al.

(10) Patent No.: US 6,882,224 B1
(45) Date of Patent: Apr. 19, 2005

(54) SELF-BIASING FOR COMMON GATE AMPLIFIER

(75) Inventors: Michael J. Gaboury, Burnsville, MN (US); Eric D. Groen, Ankeny, IA (US)

(73) Assignee: Xilinx, Inc., San Jose, CA (US)

( * ) Notice: Subject to any disclaimer, the term of this patent is extended or adjusted under 35 U.S.C. 154(b) by 49 days.

(21) Appl. No.: 10/407,281

(22) Filed: Apr. 3, 2003

(51) Int. Cl.[7] .............................................. H03F 3/45
(52) U.S. Cl. ...................................... 330/253; 330/261
(58) Field of Search ................................ 330/253, 257, 330/261, 263, 264, 285, 296

(56) References Cited

U.S. PATENT DOCUMENTS

| | | | | |
|---|---|---|---|---|
| 6,169,424 B1 | * | 1/2001 | Kurd | 327/53 |
| 6,392,486 B1 | * | 5/2002 | Lemay, Jr. | 330/253 |
| 6,507,471 B1 | * | 1/2003 | Colclaser et al. | 330/253 |
| 6,642,790 B1 | * | 11/2003 | Schrodinger et al. | 330/253 |

* cited by examiner

Primary Examiner—Khanh V. Nguyen
(74) Attorney, Agent, or Firm—Bever Hoffman & Harms; Kim Kanzaki

(57) ABSTRACT

A data receiver having a transfer function that exhibits peaking at high frequencies is provided to compensate an input signal provided on a transmission channel having a low pass transfer function. The data receiver includes first and second differential input terminals, which receive the differential input signal from the transmission channel. The first differential input terminal is coupled to the source of a first common gate transistor in a first self-biased common gate amplifier. The second differential input terminal is coupled to the source of a second common gate transistor in a second self-biased common gate amplifier. A differential output signal is provided from the drain terminals of the first and second common gate transistors. The first and second differential input terminals are not directly connected to any transistor gates in the data receiver, thereby enabling these differential input terminals to be safely connected directly to the transmission channel.

41 Claims, 10 Drawing Sheets

SELF-BIASING FOR COMMON GATE AMPLIFIER

FIELD OF THE INVENTION

The present invention relates to high speed serial I/O on a semiconductor device, and more particularly to a self-biased a common gate amplifier circuit.

BACKGROUND OF THE INVENTION

Communications systems are being developed that are capable of handling several hundred or more gigabits per second (GB/s) of bandwidth. At these speeds, signal transmission over long transmission channels are subject to serious problems. Losses, such as skin effect, dielectric loss, and connector loss become significant at these frequencies. Higher frequency components of the signal are more adversely affected than lower frequency components due to the low pass nature of the transmission channel.

All wired channel or optical channel applications present a more difficult problem in that the input signal has a large bandwidth. With a large bandwidth signal, there are varying degrees of signal degradation that are signal dependent. FIG. 1 is a graph illustrating a typical 8B10B encoded input signal 100, which has a very large bandwidth, from 1 MHz to 4 GHz. The 8B10B signal 100 is transmitted through a medium (transmission channel) to a data receiver. The transmission channel can include elements such as a printed circuit board trace, a connector or the space inside an optical fiber. FIG. 2 is a graph illustrating a conventional transfer function 200 for the transmission channel used to transmit the 8B10B signal 100. As mentioned above, the transfer function 200 of this transmission channel exhibits a low pass characteristic.

In order to operate at frequencies up to 10 GB/s, a data receiver must be able to tolerate an input signal (e.g., 8B10B signal 100) that has been degraded by the associated transmission channel (see, e.g., transfer function 200). The low pass transfer function of the transmission channel undesirably attenuates high frequency signals. Without compensation, this low pass transfer function degrades not only the high frequency amplitudes, but also introduces a form of signal dependent jitter commonly referred to as inter-symbol interference.

FIG. 3 is an eye diagram 300 that illustrates the level of inter-symbol interference in a signal received on a typical transmission channel. Eye diagram 300 illustrates the effects of inter-symbol interference and other transmission channel impairments in digital transmission. Eye diagram 300 is constructed by plotting the amplitude of a random data signal against time on a fixed interval (unit) axis. Upon reaching the end of the fixed interval (e.g., 100 picoseconds for a 10 GB/s system), the amplitude of the fixed signal wraps around to the beginning of the fixed interval (0 picoseconds). Thus, eye diagram 300 consists of many overlapping curves. The center region 301 of eye diagram 300, which is referred to as the "eye", exhibits a length L1 and a width W1. It is desirable for the eye to have a relatively large length L1 and width W1, such that the data symbols can be readily distinguished from one another. However, center region 301 exhibits a relatively small length L1 and width W1, thereby indicating that the transmission of data on the transmission channel is prone to errors due to noise and timing drift. A small length L1 and width W1 makes signal reception and recovery difficult for the associated data receiver, which usually results in a high bit error rate (BER). High bit error rate causes packet loss, and thus reduces the effective bandwidth. It would therefore be desirable to have a data receiver that is capable of receiving the data signal represented by eye diagram 300, and in response, provide an output signal having an eye diagram with a relatively wide "eye".

FIG. 4 is a circuit diagram of a conventional data receiver 400, which includes input pads 401–402, electrostatic discharge (ESD) protection circuit 403, and differential amplifier 404. A differential input signal is provided to input pads 401–402 via a transmission channel 410. This differential input signal is routed through ESD protection circuit 403 to differential amplifier 404. In response, differential amplifier 404 provides a differential output signal to an associated core circuit (not shown).

ESD protection circuit 403 includes diodes 411–416, which are connected between the $V_{DD}$ and $V_{SS}$ voltage supply terminals as illustrated, and resistors 421 and 422, which are connected in series between input pads 401–402, respectively, and input terminals of differential amplifier 404, respectively. ESD protection circuit 403 protects differential amplifier 404 and the associated core circuit from ESD events occurring on pads 401 and/or 402.

Resistors 421 and 422 are necessary because the input terminals of differential amplifier 404 are directly connected to the gates of transistors of a differential pair within differential amplifier 404. Thus, resistors 421 and 422 provide protection to these transistors when a charge device model (CDM) ESD event occurs on pads 401 and/or 402. These series resistors 421–422 undesirably add a pole to the transfer function of data receiver 400. These series resistors 421–422 also undesirably attenuate the high frequency transfer function of data receiver 400, thereby exacerbating the low pass function of transmission channel 410. It would therefore be desirable to have a data receiver that does not require resistors connected in series between the pads and the amplifier.

SUMMARY

Accordingly, the present invention provides a data receiver that compensates for the low pass function of an associated transmission channel. As a result, this data receiver can provide an output data signal that is not prone to inter-symbol interference.

An exemplary embodiment of the data receiver of the present invention includes a first pad and a second pad coupled to receive a differential input signal from the transmission channel. The differential amplifier, which includes a pair of self-biased common gate amplifiers, is directly connected to the first and second pads. More specifically, the differential amplifier includes a first self-biased common gate amplifier coupled to the first pad, and a second self-biased common gate amplifier connected to the second pad. The first common gate amplifier includes a first common gate transistor having a source coupled to the first pad. The second common gate amplifier includes a second common gate transistor having a source coupled to the second pad. A differential output signal is proved on the drains of the first and second common gate transistors.

The exemplary embodiment of the differential amplifier of the present invention advantageously adds a zero to the transfer function of the data receiver, thereby compensating for the pole in the transfer function of the associated transmission channel. That is, the differential amplifier of the present amplifier provides a peaking of the frequency response, which compensates for the low pass transfer function of the associated transmission channel.

The first and second pads are coupled to source regions of n-channel transistors within the differential amplifier of an embodiment of the present invention. Because the first and second pads are not directly connected to transistor gates within the differential amplifier, the associated ESD protection circuit does not require resistors connected in series with these pads. The absence of such series-connected resistors advantageously eliminates a pole from the transfer function of the data receiver, and enables the data receiver to exhibit a higher frequency transfer function.

In accordance with another embodiment of the present invention, half of the above-described differential data receiver can be used to receive a single-ended (i.e., non-differential) input signal and provide a single-ended output signal.

In accordance with yet another embodiment, the peaking of the transfer function of the differential (or single-ended) data receiver can be modified by varying the characteristics of resistors and capacitors present in the data receiver. In yet another embodiment, the termination resistance exhibited by the differential (or single-ended) data receiver can be varied by varying bias currents provided to the data receiver.

The present invention will be more fully understood in view of the following description and drawings.

DETAILED DESCRIPTION

In general, the present invention provides a method and apparatus for self-biasing a common gate amplifier, which beneficially provides frequency compensation for high-speed serial input/output (I/O) transmission.

Figure 1:
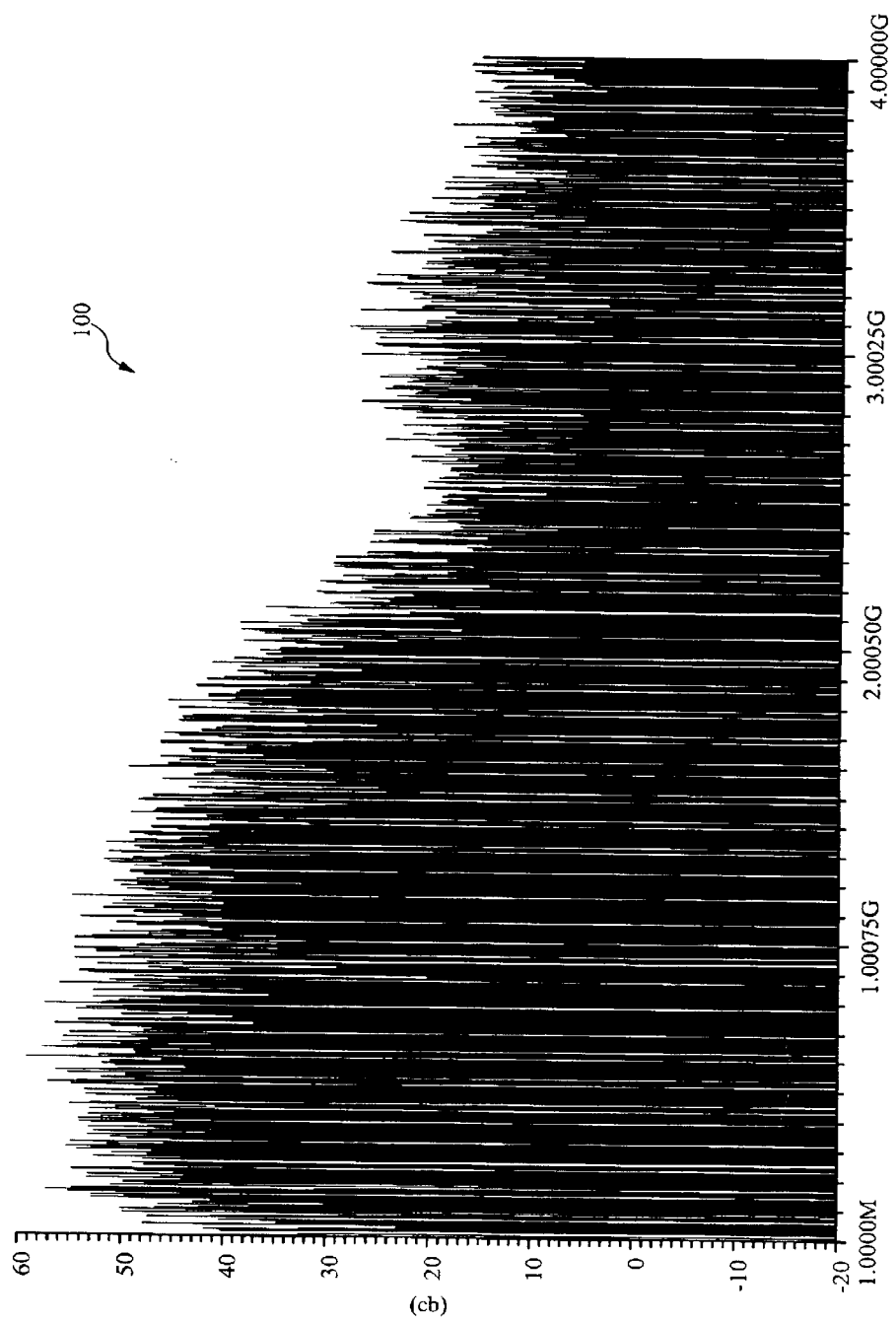
FIG. 1 is a graph illustrating a typical 8B10B encoded input signal, which has a relatively large bandwidth.
Figure 2:
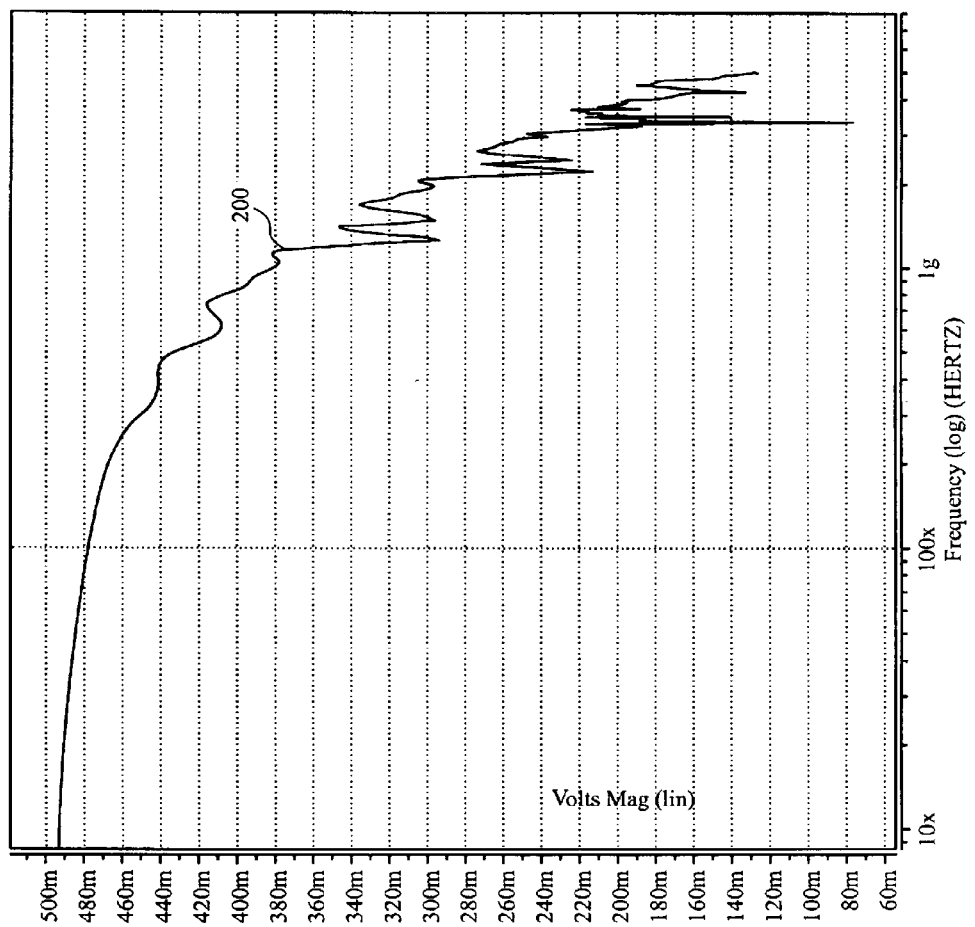
FIG. 2 is a graph illustrating a conventional transfer function for a transmission channel used to transmit the 8B10B signal of FIG. 1.
Figure 3:
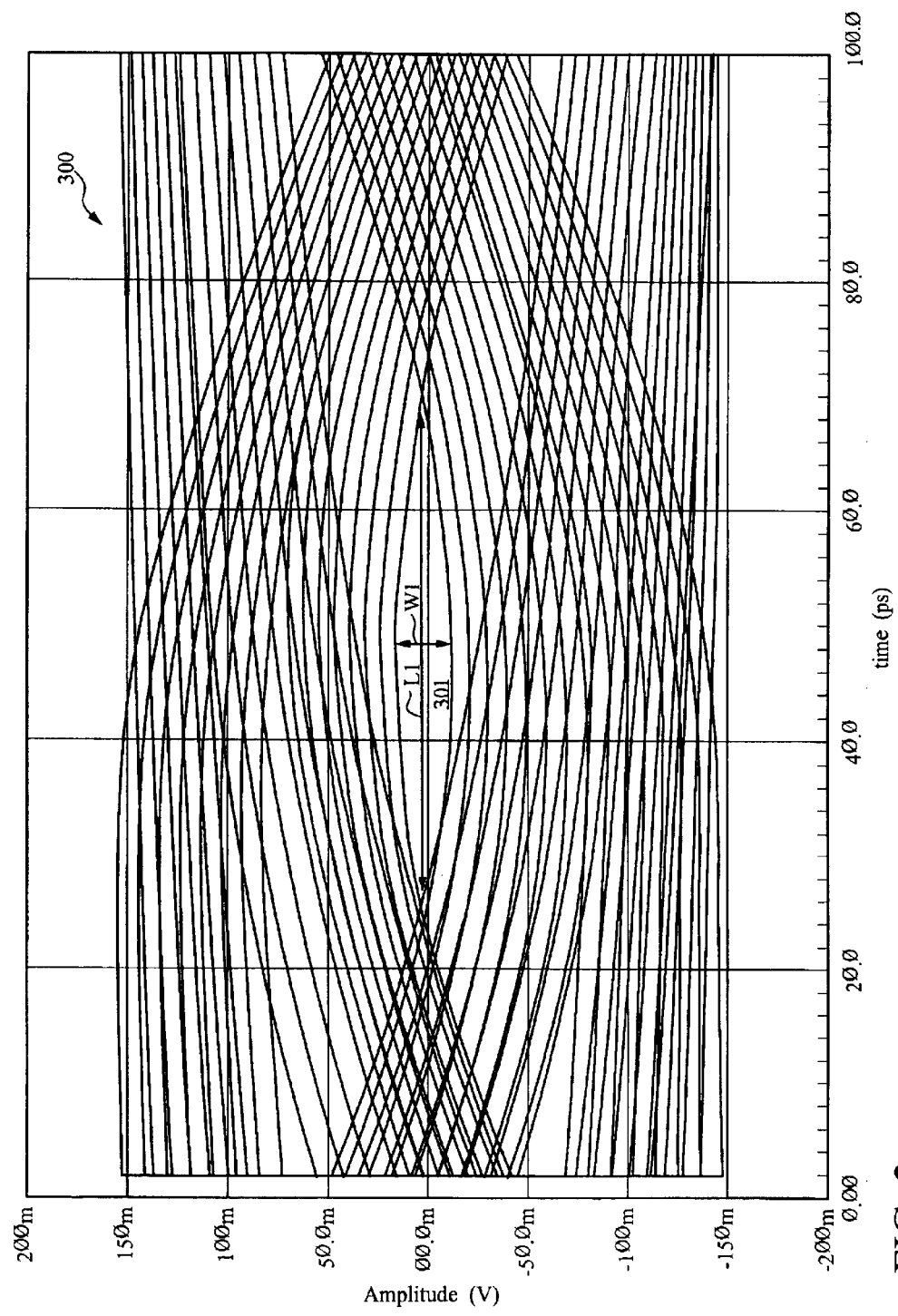
FIG. 3 is an eye diagram that illustrates the level of inter-symbol interference in a signal received on a typical transmission channel.
Figure 4:
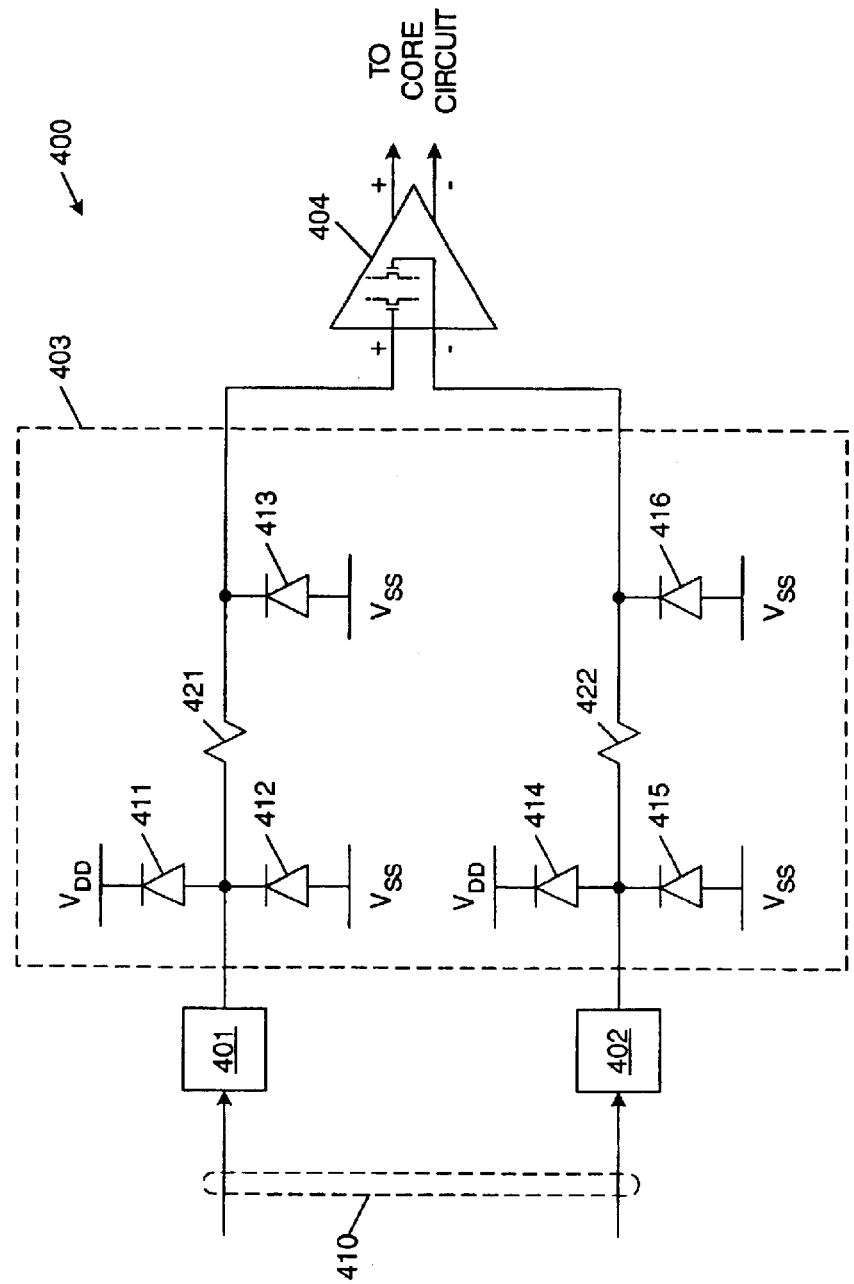
FIG. 4 is a circuit diagram of a conventional data receiver, which includes input pads, electrostatic discharge (ESD) protection circuit, and a differential amplifier.
Figure 5:
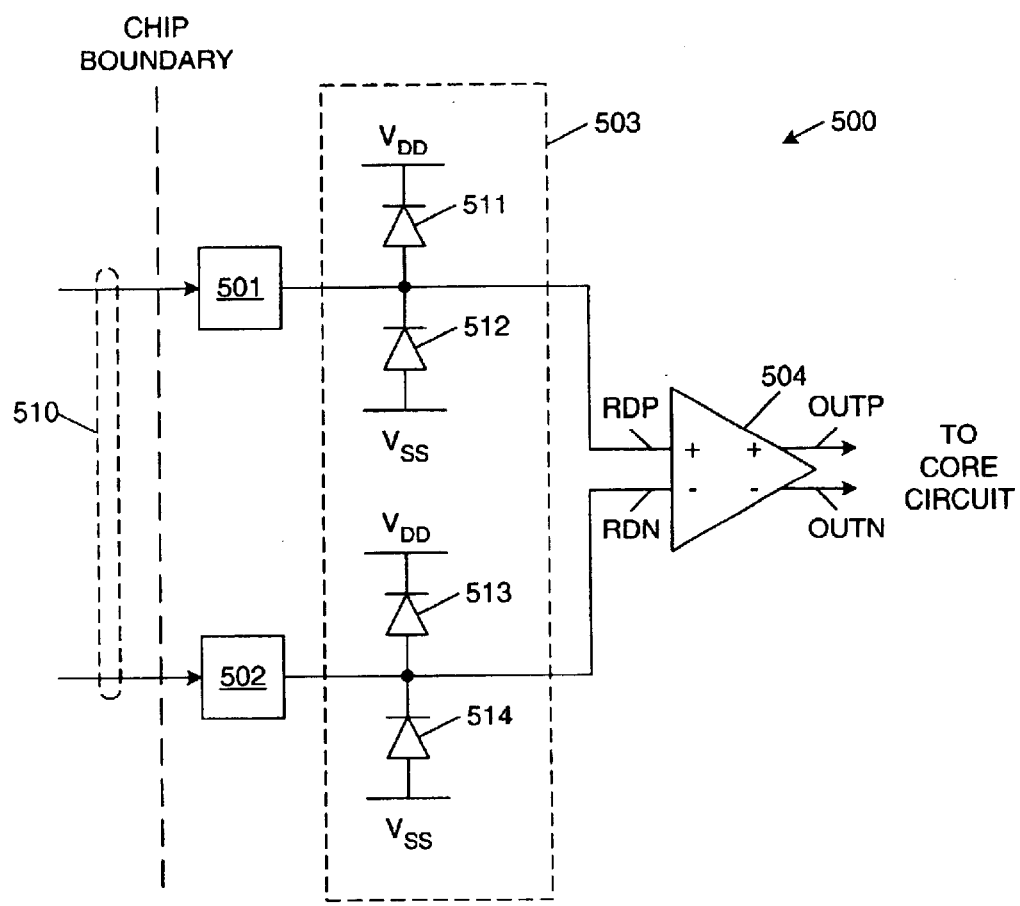
FIG. 5 is a block diagram of a data receiver in accordance with one embodiment of the present invention.

FIG. 5 is a block diagram of a data receiver 500 in accordance with one embodiment of the present invention.

Data receiver 500 includes input pads 501–502, ESD protection circuit 503 and differential amplifier 504. Input pads 501–502 are coupled to receive a differential input signal from transmission channel 510. As described above, transmission channel 510 exhibits a low pass transfer function. Input pads 501–502 are coupled to ESD protection circuit 503, which includes diode elements 511–514. Diode element 511 is coupled between input pad 501 and the $V_{DD}$ voltage supply terminal, and diode element 512 is coupled between input pad 501 and the $V_{SS}$ voltage supply terminal. Similarly, diode element 513 is coupled between input pad 502 and the $V_{DD}$ voltage supply terminal, and diode element 514 is coupled between input pad 502 and the $V_{SS}$ voltage supply terminal. Diode elements 511–514 protect differential amplifier 504 and the associated core circuit from ESD events occurring on pads 501 and/or 502.

Input pads 501 and 502 are also directly connected to the input terminals RDP and RDN of differential amplifier 504. As described in more detail below, differential amplifier 504 is designed such that these input terminals RDP and RDN are connected to transistor source regions within amplifier 504. Because the input terminals RDP and RDN are not directly connected to transistor gates within differential amplifier 504, ESD protection circuit 503 advantageously does not require resistors connected in series between pads 501 and 502 and the input terminals RDP and RDN, respectively. As a result, a pole is advantageously eliminated from the transfer function of data receiver 500, thereby enabling data receiver 500 to exhibit a relatively wide pass band or a higher corner frequency.

Differential amplifier 504 provides a differential output signal on output terminals OUTP and OUTN, in response to the differential input signal provided on input terminals RDP and RDN. The voltages on input terminals RDP and RDN are designated $V_{RDP}$ and $V_{RDN}$, respectively. Similarly, the voltages on output terminals OUTP and OUTN are designated $V_{OUTP}$ and $V_{OUTN}$, respectively. As described in more detail below, differential amplifier 504 adds a zero to the transfer function of transmission channel 510, thereby compensating for the low pass transfer function of transmission channel 510. The differential output terminals OUTP and OUTN are coupled to a core circuit of the associated communication system.

Figure 6:
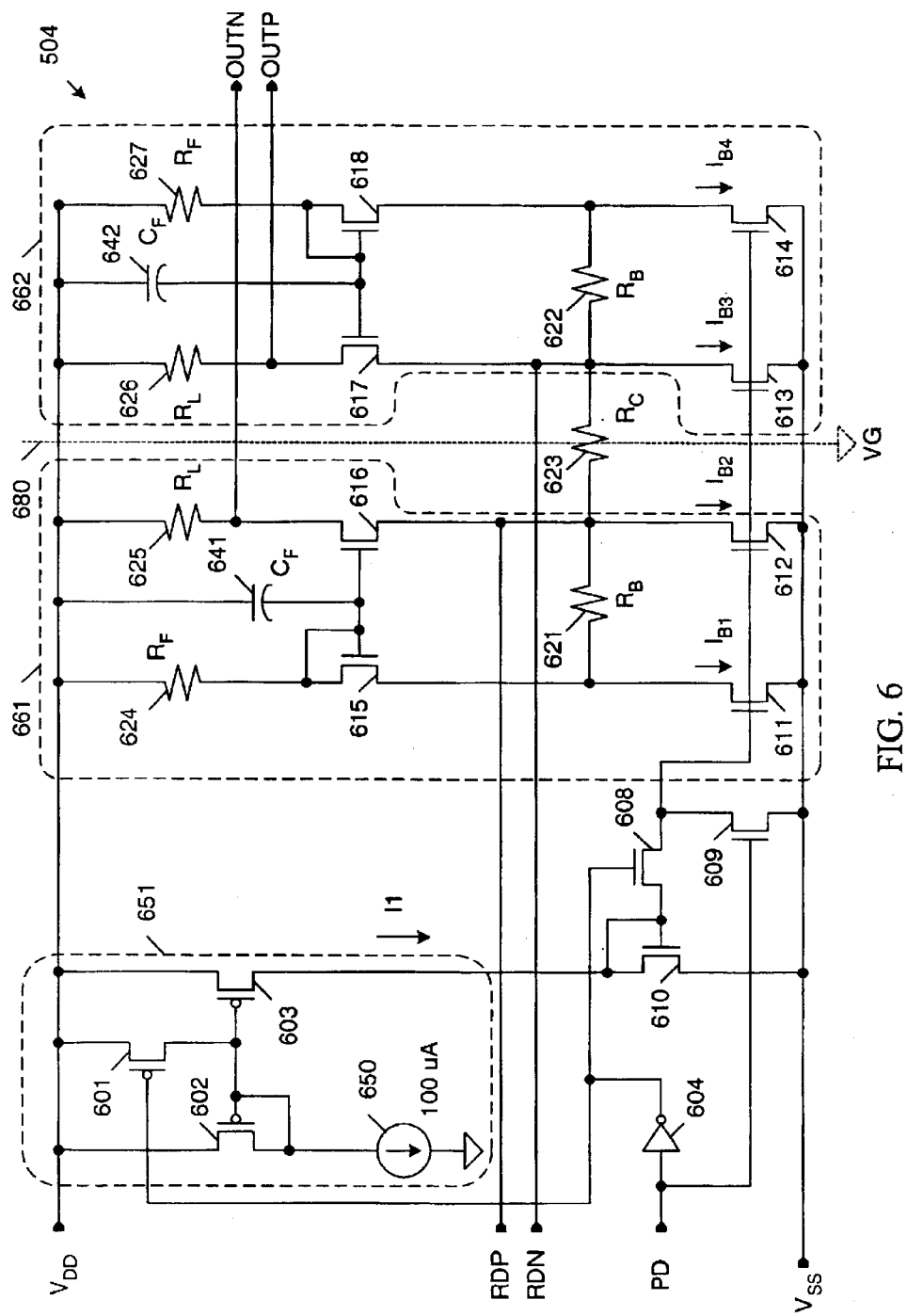
FIG. 6 is a circuit diagram of a differential amplifier of the data receiver of FIG. 5 in accordance with one embodiment of the present invention.

FIG. 6 is a circuit diagram of differential amplifier 504 in accordance with one embodiment of the present invention. Differential amplifier 504 includes p-channel transistors 601–603, inverter 604, n-channel transistors 610–618, resistors 621–627, capacitors 641–642 and constant current source 650.

P-channel transistors 601–603 and constant current source 650 are connected to form a bias circuit 651. Bias circuit 651 is enabled and disabled in response to a power down signal PD. When power down signal PD is activated high, inverter 604 provides a logic low signal to the gate of p-channel transistor 601, thereby turning on this transistor 601. When transistor 601 is turned on, the gates of p-channel transistors 602 and 603 are coupled to the $V_{DD}$ voltage supply terminal, thereby turning off these transistors 602–603, and disabling bias circuit 651.

When power down signal PD is de-activated low, inverter 604 provides a logic high signal to the gate of p-channel transistor 601, thereby turning off this transistor 601. Under these conditions, the gates of p-channel transistors 602 and 603 are biased in response to constant current source 650. In the described embodiment, constant current source provides a constant current of about 100 micro-Amps, which flows through p-channel transistor 602. P-channel transistors 602 and 603 are connected as a current mirror circuit, such that a current I1 of about 100 micro-Amps also flows through p-channel transistor 603. In other embodiments, the constant current source 650 can be controlled to reduce power consumption, to compensate for process variations, or to modify the transfer function of data receiver 500.

The current I1 is applied to another current mirror circuit, which includes n-channel transistors 610–614. N-channel transistors 608 and 609 are configured to enable and disable this second current mirror circuit in response to the power down signal PD. When power down signal PD is activated high, inverter 604 provides a logic low signal to the gate of n-channel transistor 601, thereby turning off this transistor 601. Under these conditions, n-channel transistor 610 is decoupled from the other transistors 611–614 of the second current mirror circuit. The logic high power down signal PD also turns on n-channel transistor 609. Turned on transistor 609 couples the gates of n-channel transistors 611–614 to the $V_{SS}$ voltage supply terminal, thereby turning off these transistors 611–614.

When the power down signal PD is de-activated low, inverter 604 provides a logic high signal to the gate of n-channel transistor 608, thereby turning on this transistor. Under these conditions, n-channel transistor 610 is coupled to the other transistors 611–614 of the second current mirror circuit. The logic low power down signal PD also turns off n-channel transistor 609, thereby allowing the gates of n-channel transistors 611–614 to be biased in response to the voltage on the gate/drain of n-channel transistor 610. Under these conditions, the current I1 flows through n-channel transistor 610 (because this transistor 610 is connected in series with p-channel transistor 603). The second current mirror circuit mirrors the current I1 flowing through n-channel transistor 610 (or a percentage of current I1) to each of n-channel transistors 611–614 as bias currents $I_{B1}$–$I_{B4}$, respectively.

N-channel transistors 611–612 and 615–616, resistors 621 and 624–625 and capacitor 641 are configured to form a first self-biased common gate amplifier 661. Similarly, n-channel transistors 613–614 and 617–618, resistors 622 and 626–627 and capacitor 642 are configured to form a second self-biased common gate amplifier 662. Resistor 623 joins these self-biased common gate amplifiers 661 and 662.

Within self-biased common gate amplifier 661, resistor 624, which has a resistance of $R_F$ Ohms, is coupled between the $V_{DD}$ voltage supply terminal and the drain region of n-channel transistor 615. N-channel bias transistor 611 is connected between the $V_{SS}$ voltage supply terminal and the source of n-channel transistor 615. The drain region of n-channel transistor 615 is commonly connected to the gates of n-channel transistors 615 and 616. Resistor 625, which has a resistance of $R_L$ Ohms, is coupled between the $V_{DD}$ voltage supply terminal and the drain region of n-channel common gate transistor 616. N-channel bias transistor 612 is coupled between the $V_{SS}$ voltage supply terminal and the source of n-channel common gate transistor 616. Capacitor 641, which has a capacitance of $C_F$ Farads, is coupled between the $V_{DD}$ voltage supply terminal and the gates of n-channel transistors 615 and 616. Resistor 621, which has a resistance of $R_B$ Ohms, is coupled between the source regions of n-channel transistors 615 and 616.

The input signal terminal RDP of differential amplifier 504 is coupled to the source region of common gate transistor 616, and the output signal terminal OUTN of differential amplifier 504 is coupled to the drain region of common gate transistor 616.

Self-biased common gate amplifier 662 is configured in the same manner as self-biased common gate amplifier 661. However, the input signal terminal RDN of differential amplifier 504 is coupled to the source region of common gate transistor 617, and the output signal terminal OUTP of differential amplifier 504 is coupled to the drain region of common gate transistor 617. Resistor 623, which has a resistance of $R_C$ Ohms, is connected across the source regions of common gate transistors 616 and 617, thereby joining self-biased common gate amplifiers 661 and 662.

Advantageously, the input signal terminals RDP and RDN are not directly connected to the gate of any transistor in differential amplifier 504. Rather, the input signal terminals RDP and RDN are coupled to the source regions of the various transistors 611–618. Consequently, no series-connected resistors need to be coupled to the input terminals RDP and RDN to protect differential amplifier 504 from ESD events. Diodes 501–504 protect the devices in differential amplifier 504 from human body model (HBM) ESD events. CDM ESD events, which were previously a problem for inputs connected to gates, can now be protected against in two possible ways. First, n-channel transistors 611–618 can be designed to be of a self-protecting type (sometimes called grounded gate structures). In this case, the drain region of each n-channel transistor is constructed so a large enough voltage at the drain node causes a parasitic bipolar inherent in the NMOS structure to turn on, thereby conducting current to the substrate. Alternately, the n-channel transistors 611–618 can be designed not to turn on before conduction occurs in diodes 511–514. This last method is preferred since the parasitic capacitance of this structure is much less and the bandwidth of the system is then maximized.

Because the input signal applied to input terminals RDP and RDN is a differential input signal, there is a virtual ground (VG) located at the center point of resistor 623. This virtual ground, which is shown by dashed line 680, exists at the center point of resistor 623, as well as the locations where the dashed line 680 crosses the $V_{DD}$ and $V_{SS}$ voltage supply terminals. As a result, a half-circuit analysis can be performed on either side of the virtual ground line 680. Thus, a half-circuit analysis will be performed on the circuit to the right of the virtual ground line 680 (e.g., self-biased common gate amplifier 662). In this half circuit analysis, it is understood that the input voltage is one half of the voltage on input terminal RDN, and the output voltage is one half of the voltage on output terminal OUTP. The transfer function of the half-circuit (e.g., self-biased common gate amplifier 662) is the same as the transfer function of the entire circuit (e.g., differential amplifier 504).

Figure 7:
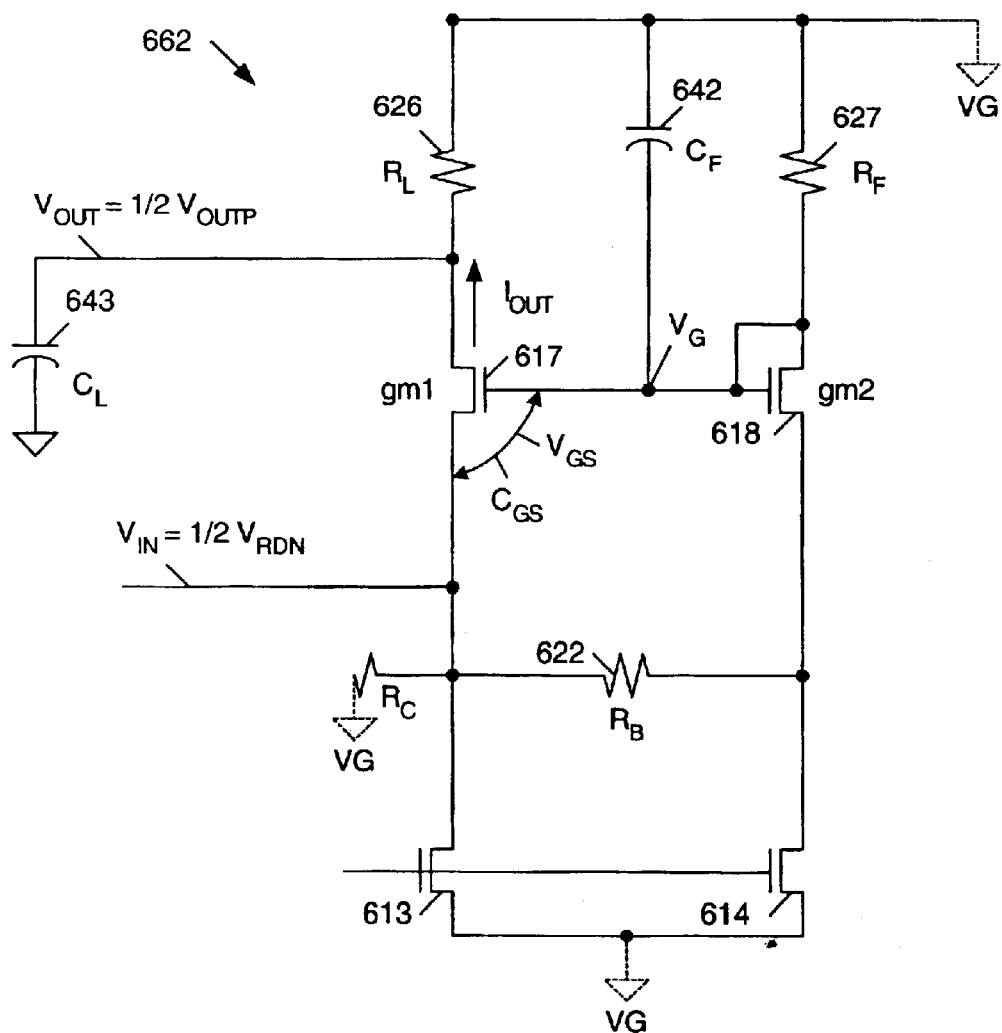
FIG. 7 is a consolidated circuit diagram of a self-biased common gate amplifier of the differential amplifier of FIG. 6, as used in a half circuit analysis in accordance with one embodiment of the present invention.

FIG. 7 is a consolidated circuit diagram of self-biased common gate amplifier 662, as used for the half circuit analysis. Equation 1 below defines the voltage VG present on the gates of n-channel transistors 617 and 618.

$$V_G = \frac{V_{IN}\left(\frac{R_F}{sC_FR_F+1}\right)}{\frac{R_F}{sC_FR_F+1} + \frac{\frac{1}{gm2}+R_B}{1+\left(\frac{1}{gm2}+R_B\right)sC_{GS}}} \quad \text{Equation 1}$$

wherein $V_{IN}$ is equal to half of the input voltage (i.e., ½($V_{RDP}$−$V_{RDN}$)), s is equal to $2\pi f\sqrt{-1}$ (wherein f is equal to the frequency of the input signal), gm2 is the transconductance of transistor 618 in Siemens, and $C_{GS}$ is the gate-to-source capacitance of transistor 617 in Farads. Equation 1 is a voltage divider equation, wherein one leg of the voltage divider circuit includes the parallel impedance of resistor 627 and capacitor 642 (i.e., $R_F\|1/sC_F$), which is coupled between the gate of transistor 618 and virtual ground. The other leg of the voltage divider circuit includes the capacitance $C_{GS}$ in parallel with the series combination of transconductance gm2 and resistor 618 (i.e., $1/sC_{gs}\|(1/\text{gm2}+R_B)$), which is coupled between the gate of transistor 618 and input terminal RDN.

Because the term "$(1/\text{gm2}+R_B)sC_{GS}$" in Equation 1 is negligible for small device sizes and currents, Equation 1 can be approximated as defined below in Equation 2.

$$V_G = \frac{V_{IN}\left(\frac{R_F}{sC_F R_F + 1}\right)}{\frac{R_F}{sC_F R_F + 1} + \frac{1}{\text{gm2}} + R_B} \qquad \text{Equation 2}$$

The gate-to-source voltage ($V_{GS}$) of common gate transistor 617 may be expressed as follows in Equation 3.

$$V_{GS} = V_G - V_{IN} \qquad \text{Equation 3}$$

Substituting the gate voltage $V_G$ from Equation 1 into Equation 3 provides the following Equation 4.

$$V_{GS} = \frac{V_{IN}\left(\frac{R_F}{sC_F R_F + 1}\right)}{\frac{R_F}{sC_F R_F + 1} + \frac{\frac{1}{\text{gm2}} + R_B}{1 + \left(\frac{1}{\text{gm2}} + R_B\right)sC_{GS}}} - V_{IN} \qquad \text{Equation 4}$$

Alternately, substituting the gate voltage $V_C$ from Equation 2 into Equation 3 provides the following Equation 5.

$$V_{GS} = \frac{V_{IN}\left(\frac{R_F}{sC_F R_F + 1}\right)}{\frac{R_F}{sC_F R_F + 1} + \frac{1}{\text{gm2}} + R_B} - V_{IN} \qquad \text{Equation 5}$$

The output current $I_{OUT}$ through common gate transistor 617 can be expressed as follows.

$$I_{OUT} = \text{gm1}*V_{GS} \qquad \text{Equation 6}$$

wherein gm1 is the transconductance of common gate transistor 617 in Siemens. Substituting the gate-to-source voltage $V_{GS}$ from Equation 4 into Equation 6 provides the following Equation 7.

$$I_{OUT} = \text{gm1}\left[\frac{\left(\frac{R_F}{sC_F R_F + 1}\right)}{\frac{R_F}{sC_F R_F + 1} + \frac{\frac{1}{\text{gm2}} + R_B}{1 + \left(\frac{1}{\text{gm2}} + R_B\right)sC_{GS}}} - 1\right]V_{IN} \qquad \text{Equation 7}$$

Alternately, substituting the approximated gate-to-source voltage $V_{GS}$ from Equation 5 into Equation 6 provides the following Equation 8.

$$I_{OUT} = \text{gm1}\left[\frac{\left(\frac{R_F}{sC_F R_F + 1}\right)}{\frac{R_F}{sC_F R_F + 1} + \frac{1}{\text{gm2}} + R_B} - 1\right]V_{IN} \qquad \text{Equation 8}$$

The output voltage $V_{OUT}$ can then be determined by multiplying the output current $I_{OUT}$ by the equivalent parallel impedance of resistor 626 (i.e., $R_L$) and capacitive load 643 (i.e., $C_L$). Accordingly, Equation 9 defines the output voltage $V_{OUT}$.

$$V_{OUT} = I_{OUT}\frac{R_L}{sC_L R_L + 1} \qquad \text{Equation 9}$$

Substituting the output current $I_{OUT}$ from Equation 7 into Equation 9 provides the following Equation 10.

$$V_{OUT} = \text{gm1}\left[\frac{\left(\frac{R_F}{sC_F R_F + 1}\right)}{\frac{R_F}{sC_F R_F + 1} + \frac{\frac{1}{\text{gm2}} + R_B}{1 + \left(\frac{1}{\text{gm2}} + R_B\right)sC_{GS}}} - 1\right]V_{IN}\frac{R_L}{sC_L R_L + 1} \qquad \text{Equation 10}$$

Alternately, substituting the approximated output current $I_{OUT}$ from Equation 8 into Equation 9 provides the following Equation 11.

$$V_{OUT} = \text{gm1}\left[\frac{\left(\frac{R_F}{sC_F R_F + 1}\right)}{\frac{R_F}{sC_F R_F + 1} + \frac{1}{\text{gm2}} + R_B} - 1\right]V_{IN}\frac{R_L}{sC_L R_L + 1} \qquad \text{Equation 11}$$

The transfer function of half circuit 662 is equal to $V_{OUT}/V_{IN}$. Note that the transfer function of half circuit 662 is equal to the transfer function of differential amplifier 504. Thus, the output voltage $V_{OUT}$ of Equation 10 provides a transfer function H1(s) as defined by Equation 12.

$$H1(s) = \text{gm1}\left[\frac{\left(\frac{R_F}{sC_F R_F + 1}\right)}{\frac{R_F}{sC_F R_F + 1} + \frac{\frac{1}{\text{gm2}} + R_B}{1 + \left(\frac{1}{\text{gm2}} + R_B\right)sC_{GS}}} - 1\right]\left[\frac{R_L}{sC_L R_L + 1}\right] \qquad \text{Equation 12}$$

Alternately, the approximated output voltage $V_{OUT}$ of Equation 11 provides a transfer function H2(s) as defined by Equation 13.

$$H2(s) = gm1\left[\frac{\left(\frac{R_F}{sC_FR_F+1}\right)}{\frac{R_F}{sC_FR_F+1}+\frac{1}{gm2}+R_B}-1\right]\left[\frac{R_L}{sC_LR_L+1}\right] \quad \text{Equation 13}$$

Figure 8:
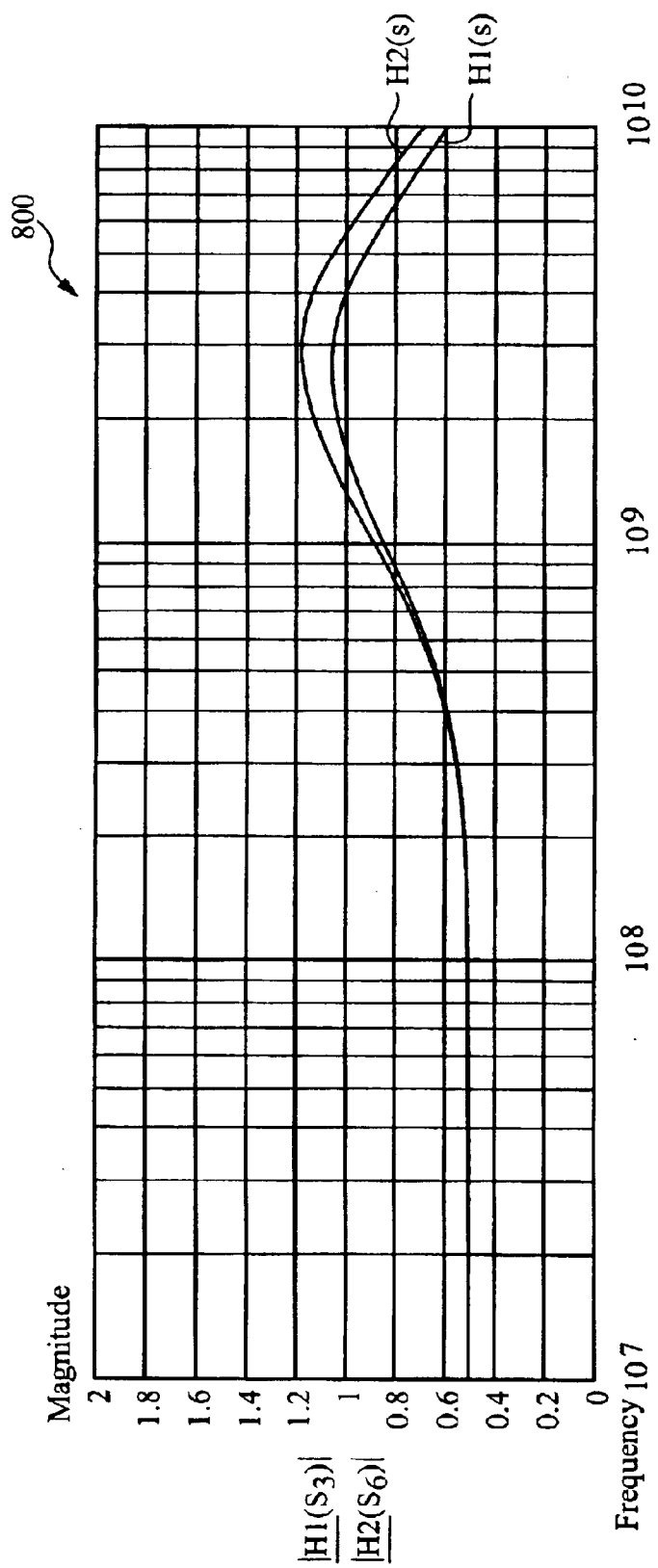
FIG. 8 is a graph illustrating transfer functions of the self-biased common gate amplifier of FIG. 7 over a frequency range of 10 MHz to 10 GHz in accordance with one embodiment of the present invention.

FIG. 8 is a graph 800 illustrating the magnitudes of transfer functions H1(s) and H2(s) over a frequency range of 10 MHz to 10 GHz in accordance with one example of the present invention. Table 1 defines the various values used in this example.

TABLE 1

| Variable | Value |
| --- | --- |
| $R_B$ | 50 Ohms |
| $R_F$ | 300 Ohms |
| $R_L$ | 75 Ohms |
| $C_F$ | $1 \times 10^{-12}$ Farads |
| $C_L$ | $400 \times 10^{-5}$ Farads |
| $C_{GS}$ | $0.15 \times 10^{-12}$ Farads |
| gm1 | 0.02 Siemens |
| gm2 | 0.01 Siemens |

As illustrated in FIG. 8, the transfer functions H1(s) and H2(s) advantageously provide for amplification of the output signal ($V_{OUT}$ or the differential signal on output terminals OUTP and OUTN) at relatively high frequencies (i.e., f>1 GHz). That is, the transfer functions H1(s) and H2(s) exhibit peaking at high frequencies. Thus, differential amplifier 504 advantageously provides compensation for the low pass transfer function of transmission channel 510.

Figure 9:
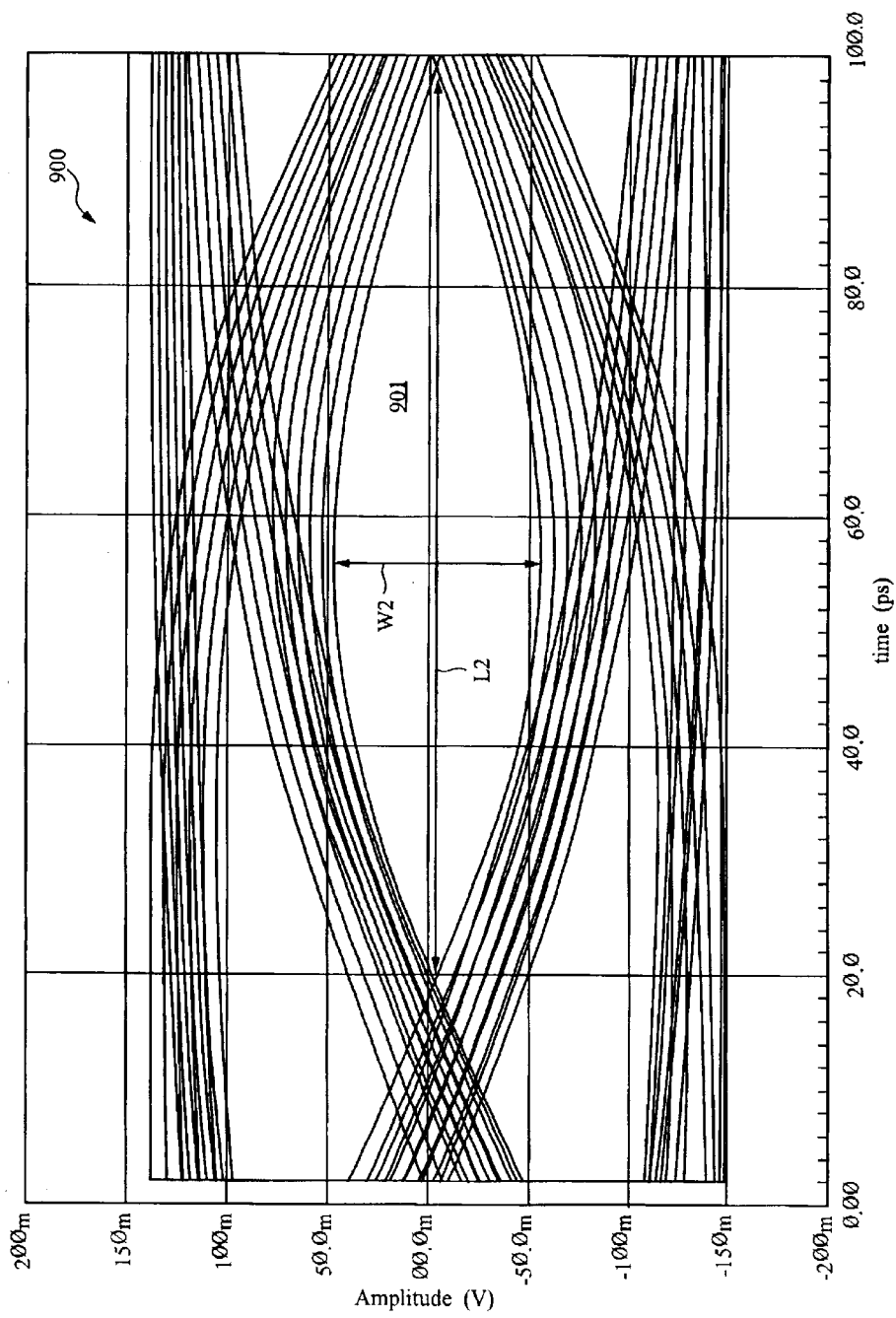
FIG. 9 is an eye diagram associated with the output signal of data receiver of FIG. 5 in accordance with one embodiment of the present invention.

FIG. 9 is an eye diagram 900 associated with the output signal of differential amplifier 504 in the described example. Note that the eye 901 of eye diagram 900 has a relatively large width W2 and length L2, thereby indicating that the output signal provided by data receiver 500 is less susceptible to inter-symbol interference than the signal received on transmission channel 510.

Figure 10:
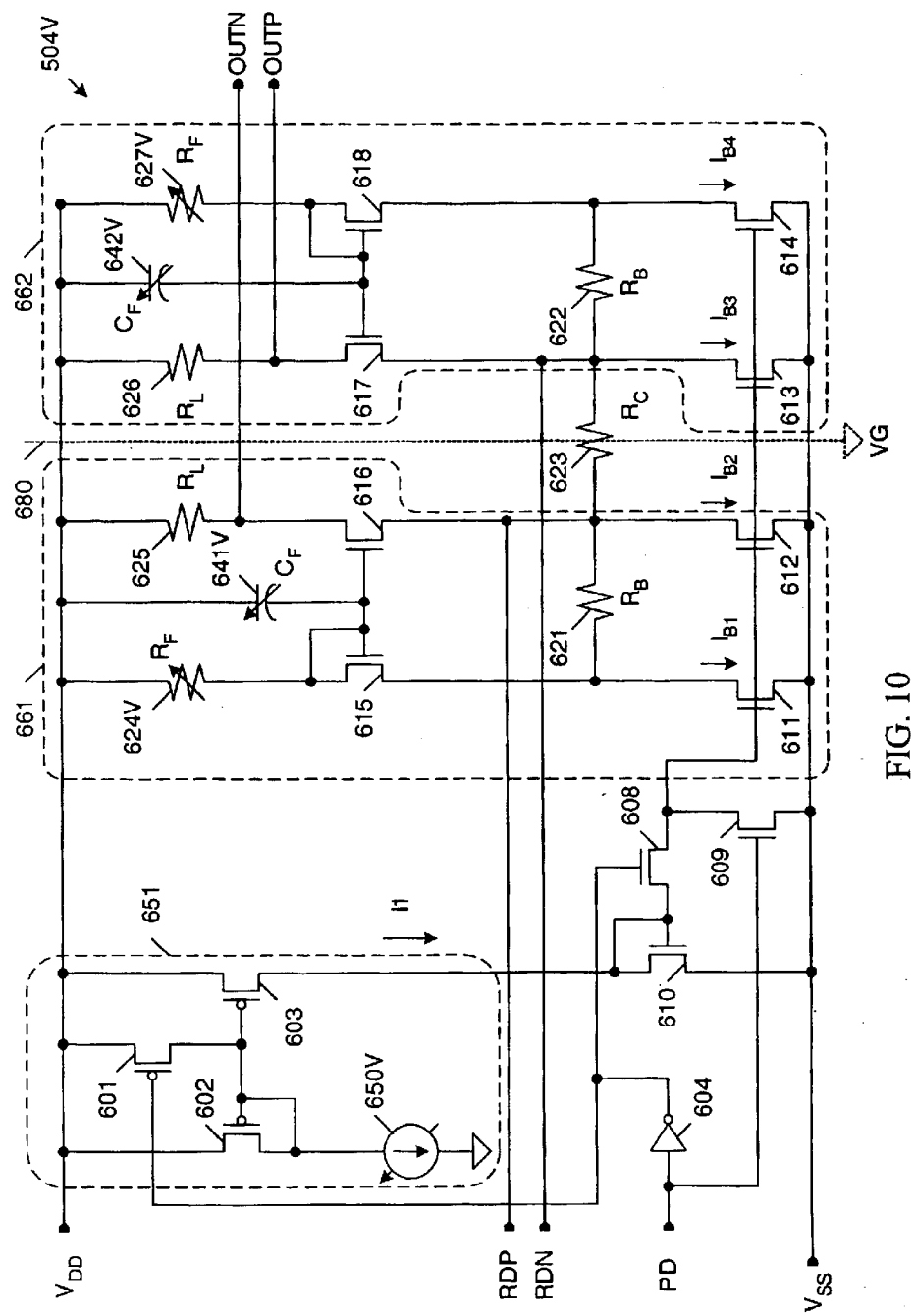
FIG. 10 is a circuit diagram of a differential amplifier of a data receiver in accordance with an alternate embodiment of the present invention.

FIG. 10 is a circuit diagram of a differential amplifier 504V in accordance with another embodiment of the present invention. Because differential amplifier 504V (FIG. 10) is similar to differential amplifier 504 (FIG. 6), similar elements in FIGS. 6 and 10 are labeled with similar reference numbers. In this embodiment, resistors 624 and 627 are replaced with variable resistor structures 624V and 627V, which have resistances that can be varied within a predetermined range. Similarly, capacitors 641 and 642 are replaced with variable capacitor structures 641V and 642V, which have capacitances that can be varied within a predetermined range. In addition, constant current source 650 is replaced with a variable constant current source 650V, which draws a current that can be varied within a predetermined range.

The peaking characteristics of the transfer function of differential amplifier 504V can be controlled by controlling the resistance $R_F$ of transistors 624V and 627V, and/or the capacitance $C_F$ of capacitors 641V and 642V. The manner in which the peaking characteristics of the transfer function are controlled in response to changes in the resistance $R_F$ and the capacitance $C_F$ is defined by Equation 10. In one embodiment, the resistances of variable resistance structures 624V and 627V are controlled by switching in (or out) a plurality of resistors in parallel, thereby decreasing (or increasing) the resistances $R_F$. Similarly, the capacitances of variable capacitance structures 641V and 642V can be controlled by switching in (or out) a plurality of parallel capacitors, thereby increasing (or decreasing) the capacitances $C_F$.

The termination resistance of differential amplifier 504V is almost entirely determined by the inverse of the transconductance of NMOS transistors 616 and 617. (Note that the double-ended termination resistance of differential amplifier 504V also includes the resistance $R_C$ of resistor 623). The transconductance of each of these NMOS transistors 616 and 617 can be defined as follows.

$$gm=\sqrt{kIW|L} \quad \text{Equation 14}$$

In Equation 14, I is the current through NMOS transistor 616 or 617, W and L are the effective width and effective length of NMOS transistor 606 or 617, and k is a process constant. Therefore the transconductance of NMOS transistors 616–617 can be adjusted by adjusting the currents $I_{B2}$ and $I_{B3}$ through these transistors (FIG. 10). The currents $I_{B2}$ and $I_{B3}$ are directly related to the current provided by current source 650V. Thus, the currents $I_{B2}$ and $I_{B3}$ can be controlled by adjusting the current provided by variable current source 650V. For example, if the current provided by current source 650V is increased from 100 μA TO 200 μA, then the transconductance (gm) of NMOS transistors 616–617 increases by a factor equal to $\sqrt{2}$, and the termination resistance decreases by a factor of $1/\sqrt{2}$.

Although the invention has been described in connection with several embodiments, it is understood that this invention is not limited to the embodiments disclosed, but is capable of various modifications, which would be apparent to one of ordinary skill in the art. For example, although the invention has been described in connection with a differential input signal, it is understood that the present invention is equally applicable to a single-ended input signal. For example, the half-circuit represented by self-biased common-gate amplifier 661 (or self-biased common-gate amplifier 662) can be used to provide a non-differential (i.e., single-ended) output signal OUTP in response to a non-differential (i.e., single-ended) input signal RDN. In this embodiment, the transconductance of NMOS transistor 616 (or NMOS transistor 617) can be used to provide a single-ended termination resistance. Thus, the invention is limited only by the following claims.

We claim:

1. A data receiver comprising:
   a first input terminal configured to receive a first input signal from a transmission channel having a low pass transfer function;
   a first self-biased common gate amplifier coupled to the first input terminal; and
   a first output terminal coupled to the first self-biased common gate amplifier;
   a second input terminal configured to receive an input signal from the transmission channel, wherein the first input signal and the second input signal form a differential input signal;
   a second self-biased common gate amplifier coupled to the second input terminal; and
   a second output terminal coupled to the second self-biased common oate amplifier, wherein the first and second output terminals are configured to provide a differential output signal;
   a first input pad coupled to the first input terminal, wherein the first input pad is directly connected to the first self-biased common gate amplifier; and a second input pad coupled to the second input terminal, wherein the second input pad is directly connected to the second self-biased common date amplifier, and wherein the first and second input pads are configured to receive the differential input signal from the transmission channel.

2. The data receiver of claim 1, further comprising a electrostatic discharge (ESD) circuit coupled to the first and second input terminals.

3. The data receiver of claim 2, wherein the ESD circuit comprises:
   a first set of diode elements connected between the first input terminal and a plurality of supply voltage terminals; and
   a second set of diode elements connected between the second input terminal and a plurality of supply voltage terminals.

4. The data receiver of claim 1, further comprising a bias circuit coupled to the first and second self-biased common gate amplifiers, wherein the bias circuit is configured to control currents flowing through the first and second self-biased common gate amplifiers.

5. The data receiver of claim 1, wherein the first self-biased common gate amplifier includes a first common gate transistor having a source coupled to the first input terminal and a drain coupled to the first output terminal, and wherein the second self-biased common gate amplifier includes a second common gate transistor having a source coupled to the second input terminal and a drain coupled to the second output terminal.

6. The data receiver of claim 5, further comprising a resistor connected between the source of the first common gate transistor and the source of the second common gate transistor.

7. The data receiver of claim 5, further comprising a variable bias circuit coupled to the first and second self-biased common gate amplifiers, wherein the variable bias circuit is configured to control currents flowing through the first and second common gate transistors, thereby controlling the transconductances of the first and second common gate transistors.

8. The data receiver of claim 5, wherein the first self-biased common gate amplifier further comprises:
   a first resistor coupled between the drain of the first common gate transistor and a first voltage supply terminal;
   a first capacitor coupled between the gate of the first common gate transistor and the first voltage supply terminal;
   a first transistor having a drain and a gate coupled to the gate of the first common gate transistor; and
   a second resistor coupled between the drain of the first transistor and the first voltage supply terminal;
and wherein the second self-biased common gate amplifier further comprises:
   a third resistor coupled between the drain of the second common gate transistor and the first voltage supply terminal;
   a second capacitor coupled between the gate of the second common gate transistor and the first voltage supply terminal;
   a second transistor having a drain and a gate coupled to the gate of the second common gate transistor; and
   a fourth resistor coupled between the drain of the second transistor and the first voltage supply terminal.

9. The data receiver of claim 8, wherein the first and second capacitors are variable-capacitance capacitors, whereby the capacitances of the first and second capacitors can be selected from a plurality of capacitances.

10. The data receiver of claim 9, wherein the second and fourth resistors are variable-resistance resistors, whereby the resistances of the second and fourth resistors can be selected from a plurality of resistances.

11. The data receiver of claim 8, wherein the second and fourth resistors are variable-resistance resistors, whereby the resistances of the second and fourth resistors can be selected from a plurality of resistances.

12. The data receiver of claim 8, further comprising:
   a first bias transistor coupled between the source of the first common gate transistor and a second voltage supply terminal;
   a second bias transistor coupled between the source of the first transistor and the second voltage supply terminal;
   a third bias transistor coupled between the source of the second common gate transistor and the second voltage supply terminal; and
   a fourth bias transistor coupled between the source of the second transistor and the second voltage supply terminal.

13. The data receiver of claim 12, further comprising:
   a fifth resistor coupled between the sources of the first common gate transistor and the first transistor;
   a sixth resistor coupled between the sources of the second common gate transistor and the second transistor; and
   a seventh resistor coupled between the sources of the first and second common gate transistors.

14. The data receiver of claim 1, wherein the first and second self-biased common gate amplifiers are configured to have a transfer function that exhibits peaking at high frequencies, thereby compensating for the low pass transfer function of the transmission channel.

15. The data receiver of claim 1, wherein the first self-biased common gate amplifier is configured to have a transfer function that exhibits peaking at high frequencies, thereby compensating for the low pass transfer function of the transmission channel.

16. A data receiver comprising:
   a first input terminal configured to receive a first input signal from a transmission channel having a low pass transfer function;
   a first self-biased common gate amplifier coupled to the first input terminal; and
   a first output terminal coupled to the first self-biased common gate amplifier; and wherein the first self-biased common gate amplifier includes a first common gate transistor having a source coupled to the first input terminal and a drain coupled to the first output terminal.

17. The data receiver of claim 16, further comprising a variable bias circuit coupled to the first self-biased common gate amplifier, wherein the variable bias circuit is configured to control current flowing through the first common gate transistor, thereby controlling the transconductance of the first common gate transistor.

18. The data receiver of claim 16, wherein the first self-biased common gate amplifier further comprises:
   a first resistor coupled between the drain of the first common gate transistor and a first voltage supply terminal;
   a capacitor coupled between the gate of the first common gate transistor and the first voltage supply terminal;
   a first transistor having a drain and a gate coupled to the gate of the first common gate transistor; and
   a second resistor coupled between the drain of the first transistor and the first voltage supply terminal.

19. The data receiver of claim 18, wherein the capacitor is a variable-capacitance capacitor, whereby the capacitance of the capacitor can be selected from a plurality of capacitances.

20. The data receiver of claim 19, wherein the second resistor is a variable-resistance resistor, whereby the resistance of the second resistor can be selected from a plurality of resistances.

21. The data receiver of claim 18, wherein the second resistor is a variable-resistance resistor, whereby the resistance of the second resistor can be selected from a plurality of resistances.

22. The data receiver of claim 18, further comprising:
a first bias transistor coupled between the source of the first common gate transistor and a second voltage supply terminal; and
a second bias transistor coupled between the source of the first transistor and the second voltage supply terminal.

23. The data receiver of claim 22, further comprising a third resistor coupled between the sources of the first common gate transistor and the first transistor.

24. A method of processing an input signal comprising:
transmitting a first input signal on a transmission channel having a low pass transfer function; and
receiving the first input signal with a first self-biased common-gate amplifier having a transfer function that exhibits peaking at high frequencies, thereby compensating for the low pass transfer function of the transmission channel.

25. The method of claim 24, further comprising programming the transfer function of the first self-biased common-gate amplifier in response to the low pass transfer function of the transmission channel.

26. The method of claim 25, wherein the step of programming the transfer function comprises selecting the resistance of a variable-resistance resistor in the first self-biased common-gate amplifier.

27. The method of claim 26, wherein the step of programming the transfer function comprises selecting the capacitance of a variable-capacitance capacitor in the first self-biased common-gate amplifier.

28. The method of claim 25, wherein the step of programming the transfer function comprises selecting the capacitance of a variable-capacitance capacitor in the first self-biased common-gate amplifier.

29. The method of claim 24, wherein the first self-biased common gate amplifier includes a first common gate transistor, the method further comprising biasing the first common gate transistor, such that a bias current flows through the first common gate transistor.

30. The method of claim 29, further comprising selecting the bias current such that the first common gate transistor exhibits a predetermined termination resistance.

31. The method of claim 24, further comprising:
transmitting a second input signal on the transmission channel, wherein the first input signal and the second input signal form a differential input signal; and
receiving the second input signal with a second self-biased common-gate amplifier, wherein the second self-biased common-gate amplifier is coupled to the first self-biased common-gate amplifier to form a differential self-biased common-gate amplifier having a transfer function that exhibits peaking at high frequencies, thereby compensating for the low pass transfer function of the transmission channel.

32. The method of claim 31, further comprising programming the transfer function of the differential self-biased common-gate amplifier in response to the low pass transfer function of the transmission channel.

33. The method of claim 32, wherein the step of programming the transfer function comprises selecting the resistance of variable-resistance resistors in the first and second self-biased common-gate amplifier.

34. The method of claim 33, wherein the step of programming the transfer function comprises selecting the capacitance of variable-capacitance capacitors in the first and second self-biased common-gate amplifier.

35. The method of claim 32, wherein the step of programming the transfer function comprises selecting the capacitance of variable-capacitance capacitors in the first and second self-biased common-gate amplifier.

36. The method of claim 31, wherein the first self-biased common gate amplifier includes a first common gate transistor and the second self-biased common gate amplifier includes a second common gate transistor, the method further comprising:
biasing the first common gate transistor, such that a first bias current flows through the first common gate transistor; and
biasing the second common gate transistor, such that a second bias current flows through the second common gate transistor.

37. The method of claim 36, further comprising selecting the first and second bias currents such that the first and second common gate transistors exhibit predetermined termination resistances.

38. A data receiver comprising:
first and second input pads configured to receive a differential input signal from a transmission channel having a low pass transfer function;
a electrostatic discharge (ESD) circuit coupled to the first and second input pads; and
a differential amplifier, comprising a transistor having a source and a drain, the ESD circuit connected to the source or the drain.

39. The data receiver of claim 38, wherein the ESD circuit comprises:
a first set of diode elements connected between the first input pad and a plurality of supply voltage terminals; and
a second set of diode elements connected between the second input pad and a plurality of supply voltage terminals.

40. The data receiver of claim 38, wherein the differential amplifier further comprises a self-biased common gate amplifier comprising the transistor.

41. A data receiver comprising:
an input terminal configured to receive an input signal from a transmission channel having a low pass transfer function;
a self-biased common gate amplifier coupled to the input terminal; and
an output terminal coupled to the self-biased common gate amplifier;
wherein the self-biased common gate amplifier is self-biased at some low and some high frequencies, and wherein the self-biased common gate amplifier includes a common gate transistor having a source coupled to the input terminal and a drain coupled to the output terminal.

* * * * *